United States Patent [19]
Pfiester et al.

[11] Patent Number: 5,373,170
[45] Date of Patent: Dec. 13, 1994

[54] SEMICONDUCTOR MEMORY DEVICE HAVING A COMPACT SYMMETRICAL LAYOUT

[75] Inventors: James R. Pfiester; James D. Hayden, both of Austin, Tex.

[73] Assignee: Motorola Inc., Schaumburg, Ill.

[21] Appl. No.: 31,513

[22] Filed: Mar. 15, 1993

[51] Int. Cl.$^5$ .......................................... H01L 27/01
[52] U.S. Cl. ........................................ 257/69; 257/68; 257/903; 365/156
[58] Field of Search .................... 257/903, 67, 68, 69, 257/66; 365/154, 156

[56] References Cited

U.S. PATENT DOCUMENTS

| | | | |
|---|---|---|---|
| 5,057,898 | 10/1991 | Adan et al. | 257/903 |
| 5,132,771 | 7/1992 | Yamanaka et al. | 357/59 |
| 5,194,749 | 3/1993 | Meguro et al. | 257/903 |
| 5,210,429 | 5/1993 | Adan | 257/67 |
| 5,239,296 | 8/1993 | Ikeda et al. | 257/385 |
| 5,262,655 | 11/1993 | Ashida | 257/66 |
| 5,296,729 | 3/1994 | Yamanaka et al. | 257/903 |
| 5,326,989 | 7/1994 | Muragishi | 257/67 |

FOREIGN PATENT DOCUMENTS 1-202858  8/1989  Japan ................... 257/903

OTHER PUBLICATIONS

Tsutsumi et al., "A High Performance SRAM Memory Cell with LDD-TFT Loads," 1991 Symp. on VLSI Technology, Digest of Technical Papers, pp. 23–24.

Primary Examiner—Andrew J. James
Assistant Examiner—Courtney A. Bowers
Attorney, Agent, or Firm—Jasper W. Dockrey

[57] ABSTRACT

A semiconductor memory cell (10) having a symmetrical layout is fabricated in first and second active regions (44, 46) of a semiconductor substrate (11). A first driver transistor (16) resides in the second active region (46), and a second driver transistor (20) resides in the first active region (44). The second driver transistor (20) has a gate electrode (55) overlying a portion of the first active region (44) and is electrically coupled to the second active region (46). A thin-film load transistor (18) resides over the first active region (44), the thin-film load transistor (18) has a thin-film channel layer (23) that overlies, and is aligned with, the gate electrode (55) of the second driver transistor (20). A second portion of the thin-film channel layer (23) extends away from the first active region (44) to form a Vcc node (36). A Vcc interconnect layer (82) overlies the thin-film load transistors and the driver transistors. The Vcc interconnect layer (82) is electrically isolated from the thin-film gate electrode and electrically contacts the second portion of the thin-film channel layer (23) at Vcc node (36). A thin-film load transistor (22) having structure corresponding with thin-film load transistor (20) resides over the second active region (46).

10 Claims, 5 Drawing Sheets

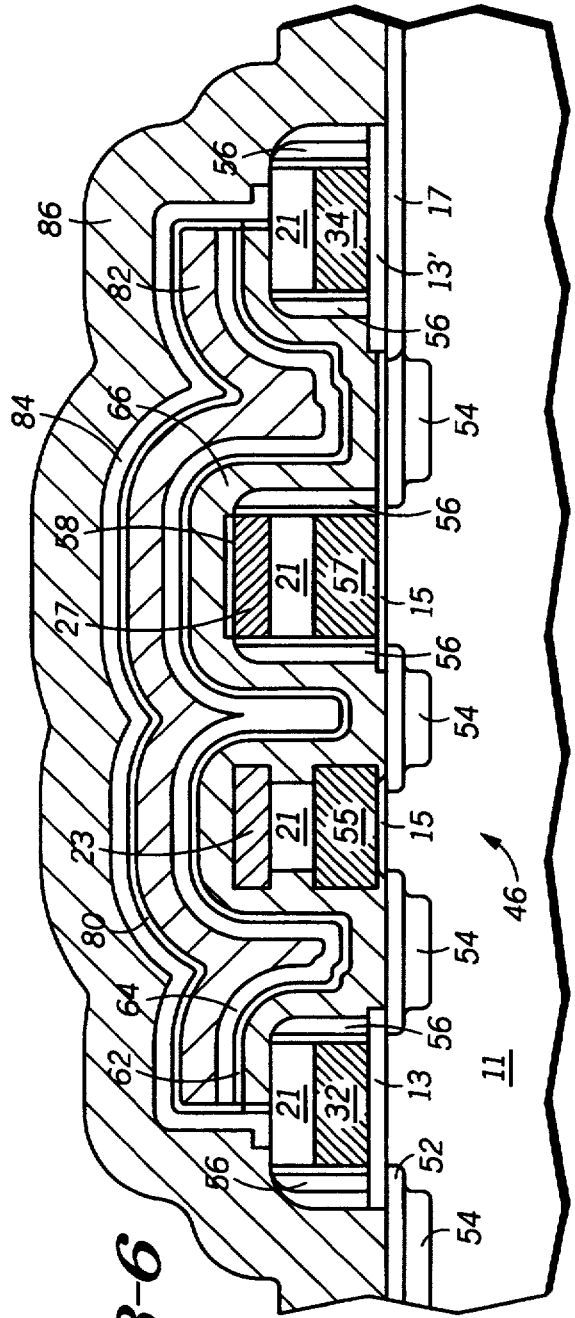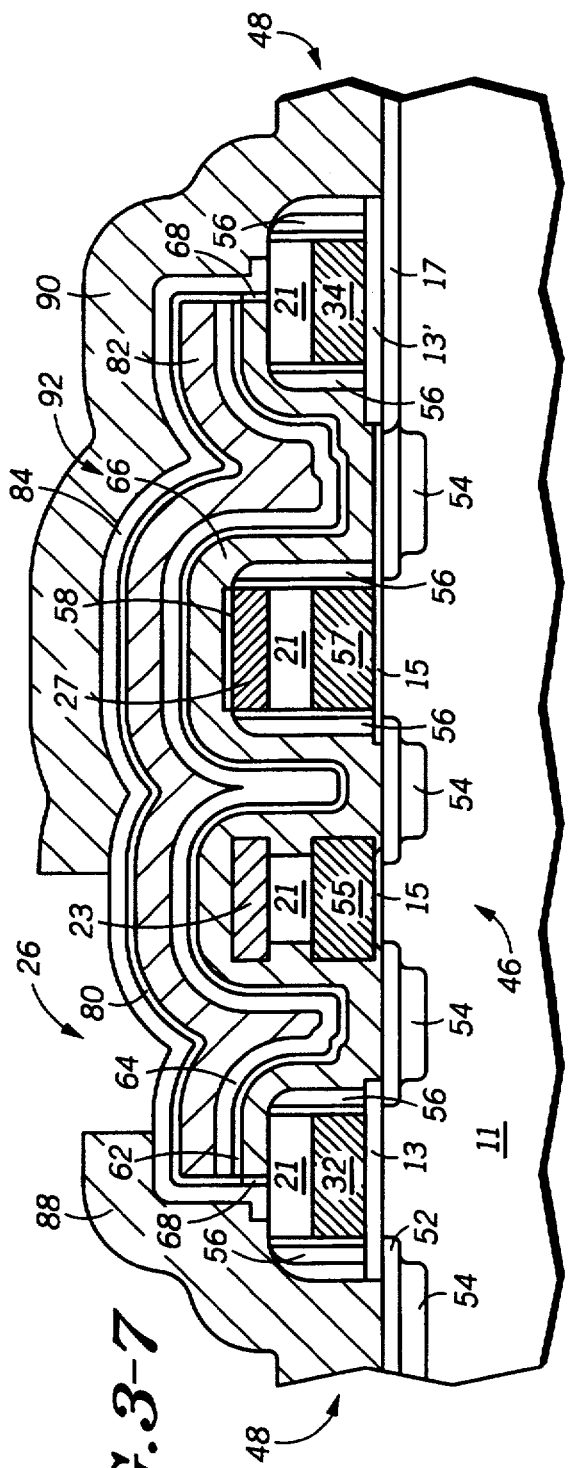

SEMICONDUCTOR MEMORY DEVICE HAVING A COMPACT SYMMETRICAL LAYOUT

RELATED APPLICATIONS

Related subject matter is disclosed in commonly assigned, co-pending patent applications having Ser. No. 07/940,143, filed Sep. 3, 1992, and Ser. No. 07/909,512, filed Jul. 6, 1992.

FIELD OF THE INVENTION

This invention relates in general semiconductor devices, and more particularly to MOS memory devices having active loud transistors.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM) or static-random-access-memory device (SRAM), the components must be arranged compactly if the overall device dimensions are not to become excessively large. This problem is especially critical in SRAM devices where a typical individual memory cell contains as many as six separate components.

One technique to reduce SRAM memory cell dimensions is to split the wordline over the cell. The wordline controls read and write functions to the cell by turning the access transistors on and off. By splitting the word line into two separate lines, a more symmetrical cell layout is possible. However, even with a split wordline memory cell design, a need remains to further reduce the overall cell dimensions. Although split wordline designs reduce the area of the cell, fundamental manufacturing limitations remain. Active surface regions of the cell must be made available for the interconnection leads providing supply and ground voltages to the cell. In addition, active surface area must be available for the formation of transistors providing read and write functions for the cell. However, downsizing of components can only be pursued to the limit of the line-width definition capability of the manufacturing process.

Another technique for fabricating a memory cell having a small surface area is to stack MOS transistors in a vertical arrangement. Typically, a driver transistor is formed in the substrate having source, drain, and channel regions in the substrate and a gate electrode overlying the substrate surface. Then, a load transistor is formed in a thin-film layer overlying the first transistor. By adding an additional electrical component to the device, the thin-film transistor increases the functional capacity of a device while not consuming additional surface area, or requiring further downsizing of components.

While stacking transistors in a vertical arrangement can reduce the surface area of a memory cell, valuable surface area must still be allocated for coupling electrical signals to the memory cell. The electrical signals are typically introduced by metal leads overlying the cell. As the overall area dimensions of the cell decrease, the metal leads carrying electrical signals to an from the cell must be brought closer together. Constructing a cell with stacked transistors can aggravate this problem because elaborate contact interconnections schemes are typically required in a stacked transistor memory cell. Therefore, new cell designs and process methodology must be employed if further reduction in memory cell area is to be achieved while avoiding performance degradation of the memory cell.

SUMMARY OF THE INVENTION

In practicing the present invention there is provided a semiconductor memory cell including load transistors and a Vcc interconnect layer formed in thin-film layers overlying the driver transistors. A portion of the Vcc interconnect layer and thin-film layer of each load transistor extend onto field oxide regions adjacent to the memory cell. The extended regions of the Vcc interconnect layer provide a convenient contact site for electrically coupling a Vcc interconnect, carried by an overlying conductive layer, to the memory cell. In one embodiment, a semiconductor substrate is provided having first and second active regions therein. A driver transistor resides in the first active region, the driver transistor having a gate electrode overlying a portion of the first active region and electrically coupled to the second active region. A thin-film load transistor also resides in the first active region, the thin-film load transistor has a thin-film layer that overlies, and is aligned with, the gate electrode of the driver transistor. A thin-film gate electrode overlies a first portion of the thin-film layer and is electrically coupled to the first active region. A second portion of the thin-film layer extends away from the first active region. A Vcc interconnect layer overlies the thin-film load transistor and the driver transistor. The Vcc interconnect layer is electrically isolated from the thin-film gate electrode and electrically contacts the second portion of the thin-film layer.

BRIEF DESCRIPTION OF THE DRAWINGS

FIGS. 3-1 through 3-7, illustrate, in cross-section, process steps in accordance with the invention and illustrating a portion of the memory cell of FIG. 2 taken along section line 3—3; and FIG. 4 illustrates, in cross-section, a portion of the memory cell illustrated in FIG. 2 taken along section line 4—4 at an intermediate stage of the process in accordance with the invention.

Figure 1:
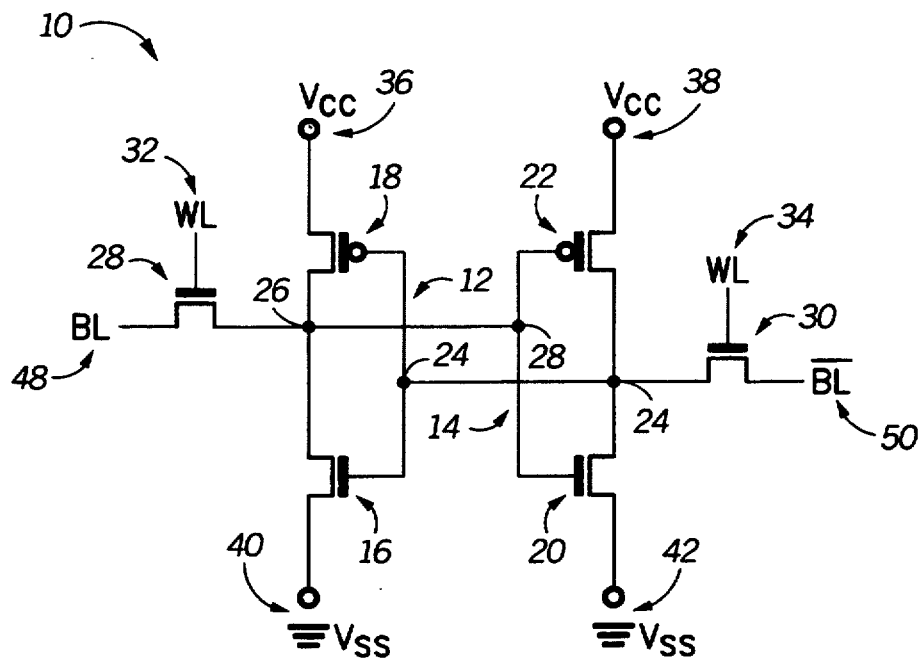
FIG. 1, illustrates, a circuit diagram of a six transistor SRAM memory cell.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

One limiting factor in reducing the surface area required to fabricate a memory cell is the need to provide power supply (Vcc) and ground (Vss) signals to the cell. The memory cell of the invention has the advantage of enabling a Vcc interconnect to be electrically coupled to the memory cell, while maintaining adequate spacing from other signal carrying leads which are also coupled to the memory cell. A Vcc contact region is formed by fabricating a memory cell in which the thin-film channel layers of the load transistors are aligned with the underlying driver gate electrodes, and in which the thin-film channel layers extend onto adjacent field oxide regions. The extended regions provide a contact site to the thin-film channel layer which is located over a field oxide region adjacent to the cell. A Vcc interconnect layer is provided which extends from the contact site and overlies the central portion of the cell. The Vcc interconnect layer is also used to form a thin-film capacitor which advantageously increases the cell capacitance.

Shown in FIG. 1 is schematic circuit diagram of an SRAM memory 10. Memory cell 10 is illustrated in an MOS integrated circuit layout in accordance with the invention in FIG. 2. Memory cell 10 includes two cross-coupled, CMOS inverters 12 and 14. CMOS inverter 12 includes an NMOS driver transistor 16 and a PMOS thin-film, load transistor 18. Similarly, CMOS inverter 14 includes an NMOS driver transistor 20 and a PMOS thin-film, load transistor 22. The input of CMOS inverter 12 is coupled to the output of inverter 14 by a shared contact formed at node 24, and the input of CMOS inverter 14 is coupled to the output of inverter 12 by a shared contact formed at node 26. Pass transistors 28 and 30 are controlled by word lines 32 and 34, respectively. Pass transistors 28 and 30 are also coupled to the outputs of inverters 12 and 14 at nodes 26 and 24, respectively. Pass transistors 28 and 30 provide bit-line access to memory cell 10. As further illustrated in FIG. 1, a Vcc power supply signal is provided to CMOS inverter 12 at node 36, and to CMOS inverter 14 at node 38. A Vss ground signal is provided to CMOS inverter 12 at node 40, and to CMOS inverter 14 at node 42.

Figure 2:
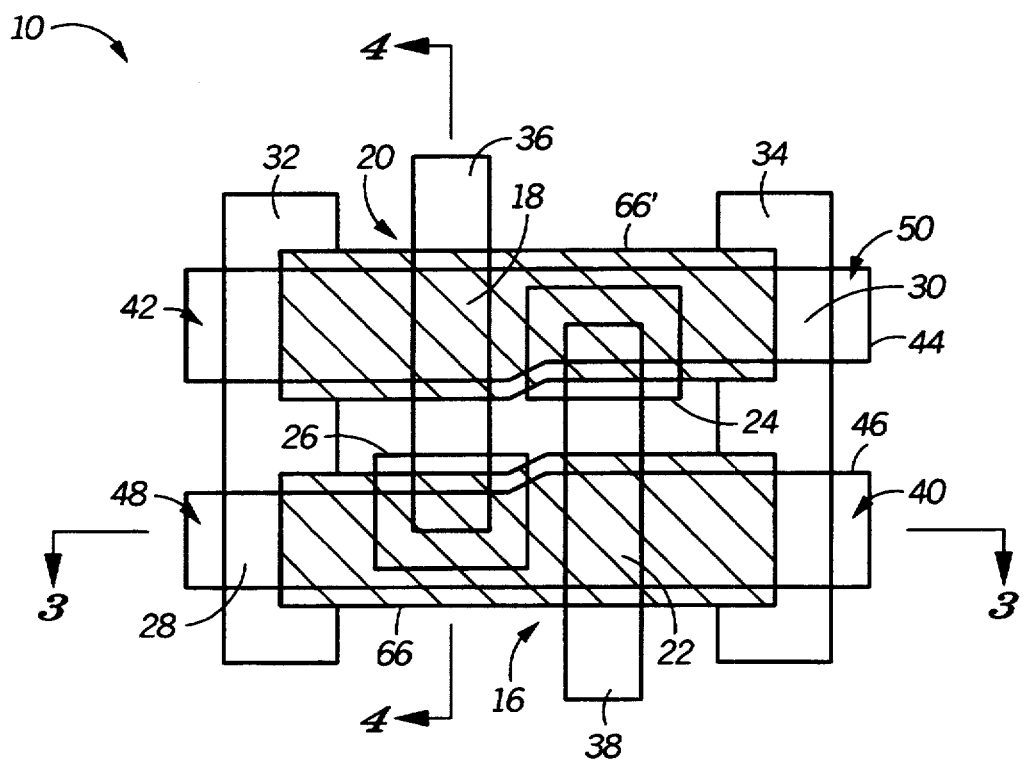
FIG. 2, illustrates, in plain view, a layout of a six transistor SRAM memory cell in accordance with the invention.

Shown in FIG. 2, is a top view of memory cell 10 illustrating the locations of the nodes and transistors noted in the circuit diagram of FIG. 1. The components of memory cell 10 are formed in two parallel opposed active regions 44 and 46. First and second parallel opposed word lines 32 and 34 overlie opposite ends of active regions 44 and 46. Pass transistor 28 is formed where word line 32 overlies active region 46, and past transistor 30 is formed where word line 34 overlies active region 44. Vss signals are introduced to memory cell 10 by contacting active regions 44 and 46 at locations adjacent to word lines 32 and 34. As illustrated in FIG. 2, a Vss signal is introduced to CMOS inverter 12 at node 40, which is located adjacent to word line 34 in active region 46. Similarly, a Vss signal is introduced to CMOS inverter 14 node 42, which is located adjacent to word line 32 in active region 44. The Vss signals introduced at nodes 40 and 42 are electrically coupled to the channel regions of driver transistors 16 and 20 by Vss cross-under regions. The Vss cross-under regions (not shown in FIG. 2) are formed under active regions 44 and 46 below word lines 32 and 34. The Vss signal entering memory cell 10 at node 42 is electrically coupled to node 24 through driver transistor 20. Similarly, the Vss signal introduced at node 40 is electrically coupled to node 26 through driver transistor 16.

Vcc interconnects are introduced to memory cell 10 at nodes 36 and 38. Node 36 is located adjacent to active region 44 between word lines 32 and 34 Node 38 is located adjacent to active region 46 between word lines 32 and 34. The Vcc interconnect introduced to memory cell 10 at node 36 is electrically coupled to node 26 by thin-film load transistor 18. Similarly, the Vcc interconnect introduced at node 38 is electrically coupled to node 24 by thin-filmed load transistor 22. Bit-line signals 48 and 50 are introduced to memory cell 10 in active regions 46 and 44, respectively. Bit-line signal 48 is introduced to active region 46 at the opposite end of active region 46 from Vss node 40. Similarly, bit-line signal 50 is introduced to active region 44 at the opposite end of active region of 44 from Vss node 42. Those skilled in the art will appreciate that the construction memory cell 10 employing parallel opposed active regions, word lines, and gate electrodes provides a compact cell layout.

Figures 1, 3:
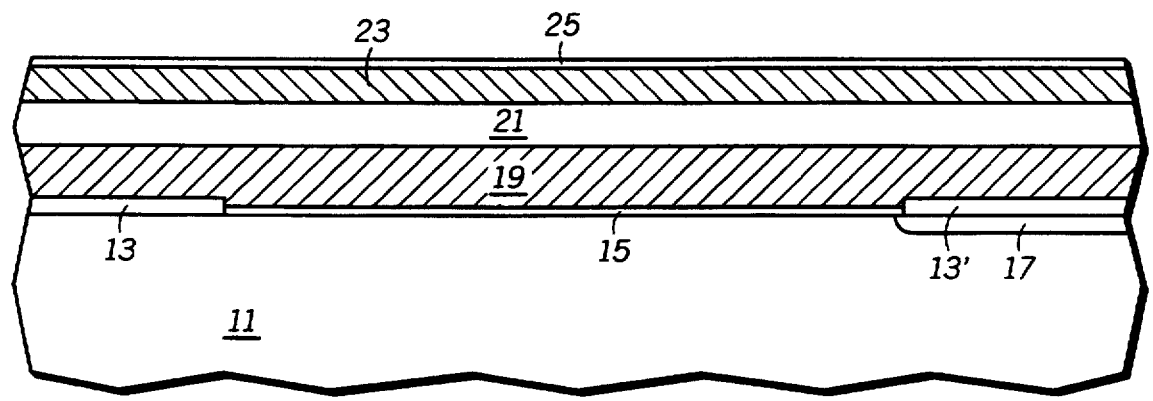
Figures 2, 3:
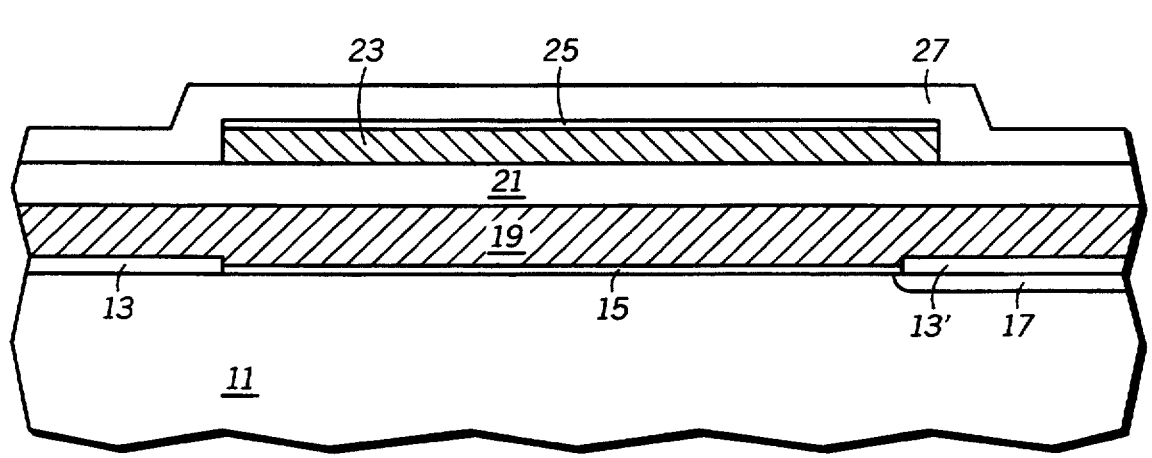
Figure 3:
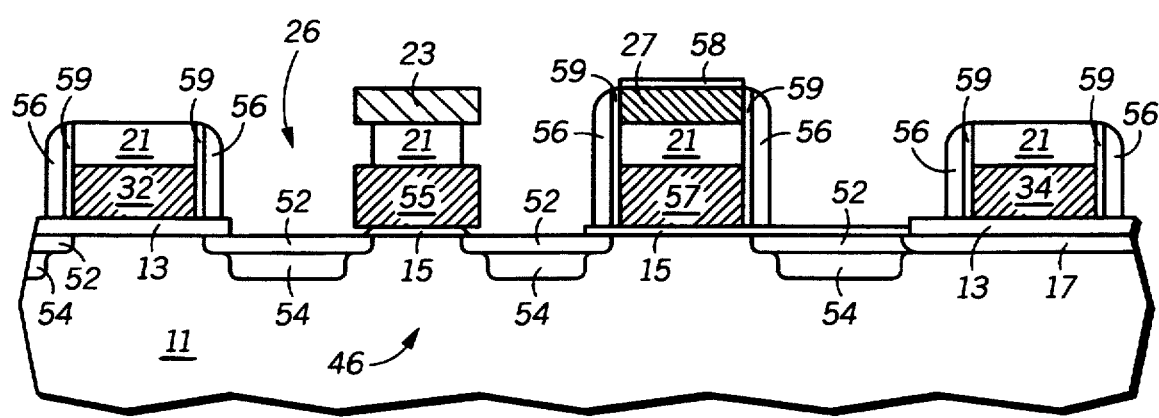
Figures 3, 4:
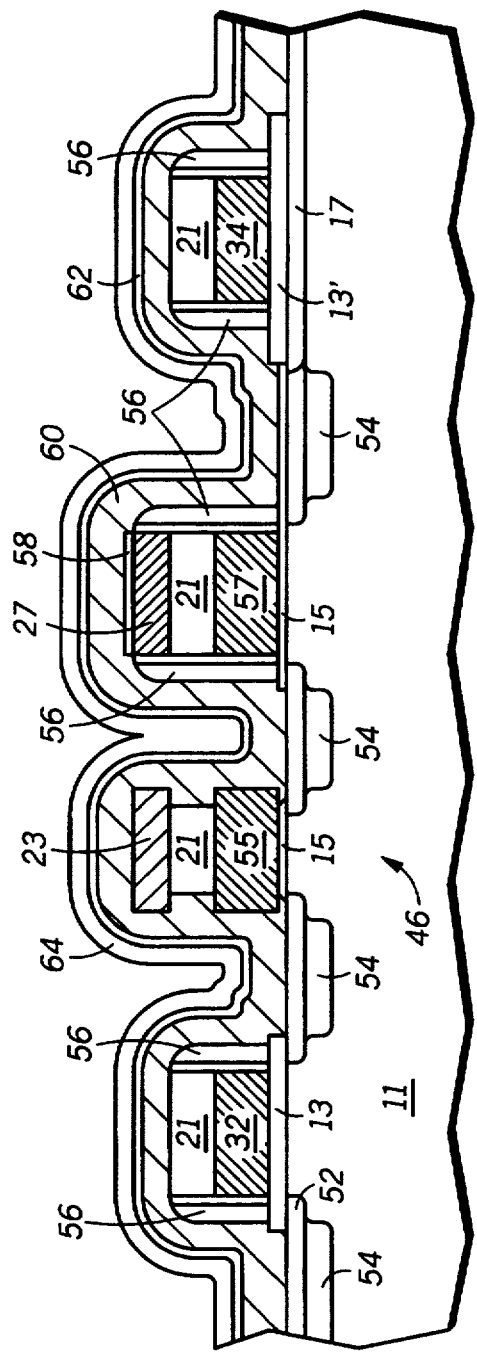

The relationship of the various components of memory cell 10 can be better understood following a description of the sequential process steps used in the fabrication of cell 10. Accordingly, the fabrication of memory cell 10 is illustrated in the sequential process steps shown in FIG. 3-1 through 3-7, and FIG. 4. FIGS. 3-1 through 3-7 illustrate, in cross-section, a portion of memory cell 10 taken along line 3—3 of FIG. 2. FIG. 4 illustrates, in cross-section, a portion of memory cell 10 taken along line 4—4 of FIG. 2. Those skilled in the art will recognize that memory cell 10 is inversely symmetrical with respect to structures formed in active regions 44 and 46, and that, although only structures formed in active region 46 are depicted in the process steps illustrated in FIGS. 3-1 through 3-7, corresponding structures are also formed, concurrently, in active region 44. Similarly, corresponding structures are formed concurrently on the opposite side of memory cell 10 from section line 4—4.

The process for fabrication of memory cell 10 of the invention is fully compatible with many different types of MOS devices including BiCMOS devices. FIG. 3-1, illustrates, a cross-sectional view of active region 46 at an early stage in the process according to the invention. Thick dielectric layers 13 and 13', and thin dielectric layer 15 overlie the surface of substrate 11. Vss cross-under region 17 underlies thick dielectric layer 13'. A semiconductor layer 19 overlies dielectric layers 13, 13' and 15. An interlevel dielectric layer 21 overlies semiconductor layer 19, and a thin-film layer 23 overlies interlevel dielectric layer 21. A thin-film channel dielectric layer 25 overlies thin-filmed layer 23.

Vss cross-under region 17 is preferably formed by oxidizing the surface of substrate 11 to form a sacrificial oxide layer, then forming a photolithographic pattern to define selected portions of active region 46. Preferably, phosphorus, or alternatively arsenic, is introduced into substrate 11 by ion implantation using the photolithographic pattern as a doping mask. In the case of phosphorus, an ion implantation dose of preferably $10^{13}$ to $10^{16}$ ions per square centimeter is used. Once implantation is complete, the photolithographic pattern is removed and the sacrificial oxide layer is etched away exposing the surface of substrate active region 46. Thin gate dielectric layer 15 is preferably formed by thermally oxidizing substrate 11 to form an oxide layer overlying active region 46. A portion of dielectric layer 15 overlying Vss cross-under region 17, will grow to a thickness of about 10 to 50 nanometers during the oxidation process. However, the remaining portion of the dielectric layer 15 will grow to a thickness of about 7 to 8 nanometers. The phosphorus implanted into active region 46 forms Vss cross-under region 17 and enhances the oxidation rate by a factor of as much as ten relative to the remaining portion of active region 46. Thus, within active region 46, the relatively higher dopant concentration in Vss cross-under region 17 creates a localized region of increased dielectric thickness during the: oxidation process.

After oxidizing substrate 11, the oxide layer is photolithographically patterned and etched to remove dielectric layer 15. The surface of substrate 11 is then oxidized again and dielectric layer 15 is re-grown to a predetermined thickness. The foregoing process results in the creation of three separate dielectric thickness, which in the order of decreasing oxide thickness are, 13', 13, and 15. Alternatively, dielectric layers 13, 13', and 15 can be formed by an initial oxidation process followed by photolithographic masking and etching a portion of the dielectric layer to form a thin region 15.

Semiconductor layer 19 is preferably formed by first depositing a thin layer of polycrystalline silicon, then ion implanting dopant into substrate 11 through the first thin polycrystalline silicon layer. The ion implant will set the threshold voltage of driver transistor 16, which will subsequently be formed in active region 46. Following the ion implantation, a second layer of polysilicon is deposited to overlie the first polycrystalline silicon layer. The electrical conductance of semiconductor layer 19 is enhanced by ion implanting arsenic into semiconductor layer 19. In a preferred embodiment, a refractory metal layer is deposited to overlie the second polysilicon layer. Semiconductor layer 19 is then subjected to a thermal annealing process to activate the arsenic implant. Once semiconductor layer 19 is annealed, interlevel dielectric layer 21 is deposited onto semiconductor layer 19. Preferably, interlevel dielectric layer 21 is silicon oxide chemical vapor deposited using tetraethylorthosilane (TEOS) source gas.

After depositing interlevel dielectric layer 21, thin-film layer 23 is preferably formed by chemical vapor deposition of polycrystalline silicon. Next, thin-film dielectric layer 25 is formed on thin-film channel layer 23 by chemical vapor deposition of silicon oxide using a TEOS source gas. Semiconductor layer 19 will form the gate electrodes for driver transistors 16 and 20, and thin-film layer 23 will form the conductive channel of thin-film load transistors 18 and 22.

The definition of the thin-film channels and the driver gate electrodes begins by removing portions of thin-film layer 23 and thin-film dielectric layer 25, as illustrated in FIG. 3-2. The portions of thin-film layer 23 and thin-film dielectric layer 25 are preferably removed by photolithographic patterning followed by reactive ion etching. Once the portions are removed, a layer of silicon nitride 29 is deposited to overlie interlevel dielectric layer 21 and thin-film dielectric layer 25. Silicon nitride layer 29 will protect thin-film dielectric layer 25 during the subsequent processing steps required to form the gate electrodes of driver transistors 16 and 20, and word lines 32 and 34.

Following the deposition of silicon nitride layer 29, a photolithographic pattern is applied and a sequential reactive ion etch is carried out to form gate electrodes for driver transistors 16 and 20, and to form word lines 32 and 34. The photolithographic patterning and sequential etching process forms the stacked gate structures illustrated in FIG. 3—3. The etching process forms word lines 32 and 34 at opposite ends of active region 46. In addition, driver gate electrodes 55 and 57 are formed overlying central portion of active region 46 intermediate to word lines 32 and 34. Thin-film layers 23 and 27 overlie driver gate electrodes 55 and 57, respectively. Thin-film layers 23 and 27 are separated from the driver gate electrodes by interlevel dielectric layer 21. Interlevel dielectric layer 21 also overlies word lines 32 and 34. Driver gate electrode 57 and drain regions 52 form the gate and source and drains of driver transistor 16 shorn in FIGS. 1 and 2. Word line 32 and drain regions 52 form the gate electrode and source and drain regions of pass transistor 28.

Subsequent to the dielectric etching process, an oxidation process is performed to form an oxide layer 59 on the vertical edges of the stacked-gate structures. An ion implant process is then carried out to form lightly doped drained regions 52 and heavily doped drained regions 54 in substrate 11, as illustrated in FIG. 3—3. Drain regions 52 and 54 are preferably formed by first implanting substrate 11 to form regions 52, then, forming temporary sidewall spacers (not shown) on the stacked gate structures. A second ion implantation step is performed using the temporary sidewall spacers as a doping mask. Those skilled in the art will recognize the forgoing steps as process steps typically used to form lightly-doped drain structures. After drain region 52 and 54 have been formed, the temporary sidewall spacers are removed by an isotopic etching process. The isotropic etch process also removes remaining portions of nitride layer 29 overlying the stacked-gate structures.

In one embodiment of the invention, the separation distance between driver gate electrodes 55 and 57 is so small that the sidewall spacers come together over the portion of substrate 11 intermediate to the gate electrodes. In this case, the sidewall spacers prevent the implanted dopant used to form drain regions 54 from reaching the substrate. Thus, in the case where the separation distance is less than the combined sidewall spacer thickness over each driver gate, drain region 52 will be the sole drain region in substrate 11 intermediate to driver gate electrodes 55 and 57.

Next, substrate 11 is oxidized to form a thin silicon oxide layer overlying the surface of active region 46. At this stage of the process, the temporary sidewall spacers and remaining portions nitride layer 29 can be removed and a second silicon nitride layer deposited and anisotropically etched to form permanent sidewall spacers 56. Alternatively, the temporary sidewall spacer can be left in place. After sidewall spacers 56 are formed, dielectric layer 25 is removed and a thin-film dielectric layer 58 is formed over thin-film layers 23 and 27. For purposes of clarity, thin-film dielectric layer 25 is only shown on thin-film channel layer 58. Preferably, thin-film dielectric layer 58 is silicon oxide chemical vapor deposited onto thin-film layer 23 using a TEOS source gas. Alternatively, thin-film dielectric layer 58 can be a composite layer consisting of a silicon nitride layer between two silicon oxide layers (ONO). In another alternative, thin-film dielectric layer 58 can be formed by the thermal oxidation of thin-film layers 23 and 27.

After forming thin-film dielectric layer 58, a photolithographic pattern is defined and sidewall spacers 56 and sidewall oxide layers 59 overlying gate electrode 55, and overlying thin-film layer 23 are etched away. In addition, portions of the silicon oxide layer overlying the surface of substrate 11 adjacent to driver gate electrode 55 are also etched away exposing the drain regions 52. Thus, a location for a shared contact is formed by removing sidewall spacer 56 and oxide layer 59 overlying driver gate electrode 55, and oxide layers overlying the surface of substrate 11 adjacent to driver gate 55, and thin-film dielectric layer 58 overlying thin-film layer 23. The shared contact will enable the input of CMOS inverter 14 to be connected to the output of CMOS inverter 12. The shared contact is illustrated as node 26 in FIGS. 1 and contact 26 in FIG. 2.

In a preferred embodiment, once the stacked gate structures are formed both interlevel dielectric layer 21 and the portion of gate dielectric layer 15 underlying driver gate electrode 55 are isotropically etched. As illustrated in FIG. 3—3, the isotropic etch process caused the dielectric layers to recede from the edge of driver gate electrode 55 and thin-film layer 23. By receding the dielectric layers away from the edge of driver gate electrode 55, upper and lower portions of the electrode are exposed. The exposed upper and lower surface regions will provide additional surface area for contact by a thin-film gate electrode to be formed at a later stage of the process.

The inventive process continues, with the deposition of thin-film gate layer 60, screen oxide layer 62, and silicon nitride layer 64, as illustrated in FIG. 3-4. Thin-film gate layer 60 is preferably polycrystalline silicon chemical vapor deposited to overlie the word lines and the stacked-gate structures. Thin-film gate layer 60 forms a metallurgical contact to driver gate 55, thin-film layer 23, drain regions 52 in substrate 11 adjacent to driver gate 55. In other regions, thin-film gate layer 60 is electrically isolated from word lines 32 and 34, driver gate electrode 57, and thin-film channel layer 27.

Figures 3, 4, 5:
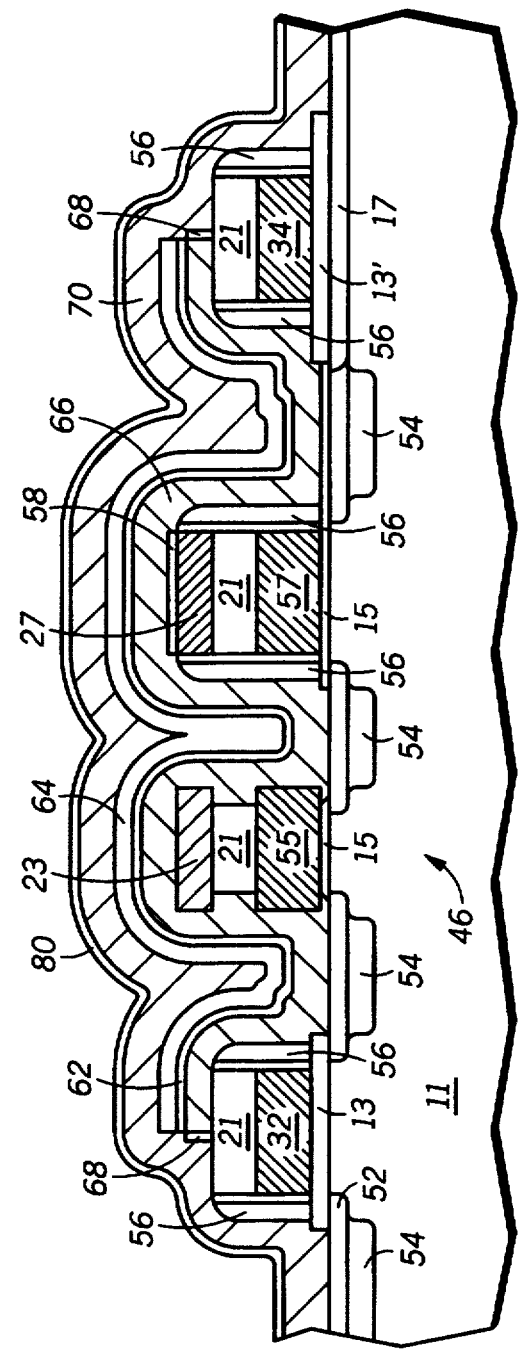
Figure 4:
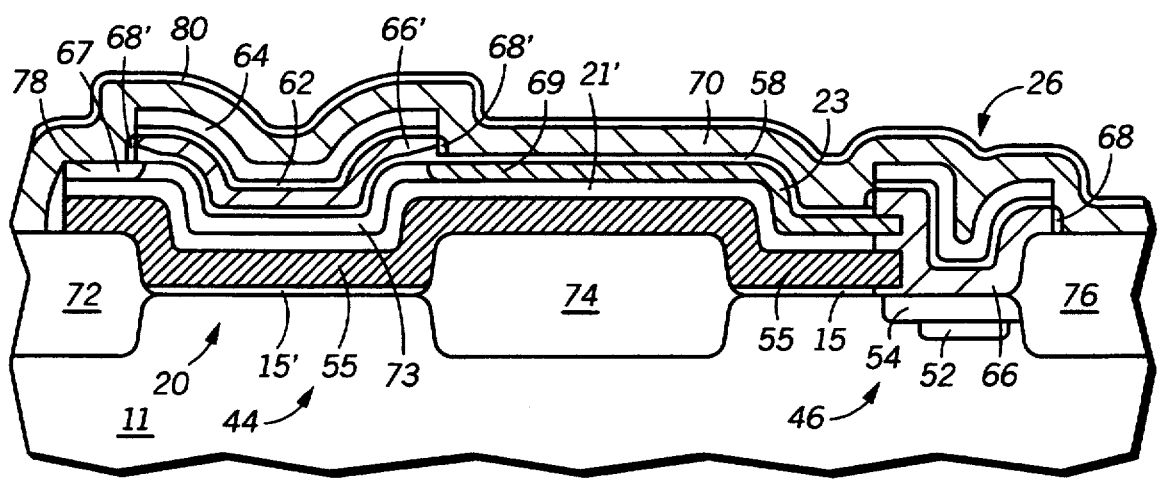

As Illustrated in FIG. 3-5, after thin-film gate layer 60, screen oxide layer 62, and a silicon nitride layer 64 are deposited, the layers are photolithographically patterned and anisotropically etched to define a thin-film gate electrode 66. Following the etching process, an oxidation step is performed to form an oxide layer 68 over the ends of thin-film gate electrode 66. Next, thin-film source and drain regions are formed in thin-film layers 23 and 27, (not shown in FIG. 3-5). In one method the thin-film source and drain regions are formed by ion implantation using gate electrodes 66 and 66′ as dopant masks. The ion implantation dose is preferably between $10^{13}$ and $10^{15}$ ions per square centimeter. In addition, the source and drain regions are also formed by auto-doping from semiconductor layers 59 and 60, which is subsequently deposited to overly the stacked gate structures. Alternatively, the source and drain regions can be completely formed by auto doping.

Accordingly, once thin-film gate electrode 66 is sealed by oxide layer 68, a semiconductor layer 70 is formed to overlie thin-film gate electrode 66 and portions of word lines 32 and 34. At this stage in the process of the invention, a cross-section through memory cell 10, taken along line 4—4, insert shown in FIG. 2, appears as illustrated in FIG. 4. As shown in FIG. 4, field oxide regions 72, 74, and 76 define active regions 44 and 46. Driver transistor 20 is formed where driver gate electrode 55 overlies active region 44. Thin-film gate electrode 66′ overlies a channel portion 73 of thin-film layer 23 forming thin-film load transistor 18 (shown in FIGS. 1 and 2). Thin-film source and drain regions 67 and 69 are shown in thin-film layer 23 on either side of gate electrode 66′. Prior to the deposition of semiconductor layer 70, a portion of thin-film dielectric layer 58 adjacent to thin-film gate electrode 66′ is removed. Upon deposition of semiconductor layer 70 a metallurgical contact 78 is formed between thin-film layer 23 and semiconductor layer 70.

As illustrated in FIG. 4, the thickness of thin-film dielectric layer 58 increases at the edges of thin-film gate electrode 66′. This configuration increases the amount of electrical insulation between semiconductor layer 70 and thin-film gate electrode 66′. The increased dielectric thickness reduces the possibility of electrical shorting between the gate and the semiconductor layer, and lowers the electrical field intensity at the gate edge. Reducing the electrical field at the gate edge improves the performance of thin-film load transistor 18 by reducing the amount current of electrical current in the transistor while it is in the off state.

The formation of contact 78 electrically couples a Vcc interconnect, carried by semiconductor layer 70, to thin-film layer 23 of thin-film load transistor 18. This connection is illustrated as node 36 in FIGS. 1 and 2. Preferably, semiconductor layer 70 is polycrystalline silicon formed by chemical vapor deposition. A thin silicon dioxide layer 80 is chemical vapor deposited onto semiconductor layer 70, preferably by using a TEOS source gas. Alternatively, thin oxide layer 80 can be formed by the thermal oxidation of semiconductor layer 70.

Returning to FIG. 3-6, the process continues, in accordance with the invention, by photolithographically patterning and sequentially etching the thin oxide layer 80 and semiconductor layer 70 to form a Vcc interconnect layer 82. Following the formation of Vcc interconnect layer 82, a silicon oxide layer 84 is deposited to overlie Vcc interconnect layer 82 and portions of word lines 32 and 34. After depositing silicon oxide layer 84, portions of silicon oxide layer 84 are removed that overlie the surface of active region 46 adjacent to word lines 32 and 34. A thick layer of polycrystalline silicon is then deposited to overlie silicon oxide layer 84 and the exposed surfaces of active region 46 adjacent to word lines 32 and 34.

Once polycrystalline silicon layer 86 is deposited, the layer is photolithographically patterned and reactive ion etched to form a bit-line contact land 88 and a Vss contact land 90, as illustrated in FIG. 3-7. Bit-line contact land 88 provides a site for electrically coupling a bit-line signal to memory cell 10 through pass transistor 28. Also, Vss contact land 90 provides a site for electrically coupling a Vss signal to memory cell 10 through Vss cross-under region 17. As previously described, corresponding structures are also fabricated in active region 44 for introducing bit-line and Vss signals to inverter 14. A Vcc interconnect is introduced to memory cell 10 by forming a contact to Vcc interconnect layer 82.

Those skilled in the art will recognize that the alignment of Vcc interconnect layer 82 with thin-film gate electrode 66, and separated therefrom by silicon nitride layer 64 and screen oxide layer 62, conveniently forms a thin-film capacitor 92. A second capacitor 92′ is also formed over active region 44 having a lower plate formed by thin-film gate electrode 66′ (not shown). Thin-film capacitor 92 and 92′ serve to increase the internal capacitance of memory cell 10 and provide soft error protection for the memory cell.

The novel arrangement of components and the associated fabrication process provides a memory cell which occupies a significantly reduced surface area as compared to memory cells of the prior art. The alignment of thin-film layers 23 and 24 with driver gate electrodes 55 and 57, respectively, permits shared contacts 24 and 26 to be formed where thin-film gate electrodes 66 and 66′ overlie the opposite thin-film layer and driver-gate electrode. Additionally, the alignment of the thin-film layers with the underlying driver gate electrodes, permits an inverter, such as inverter 12, to be fabricated having the load transistor and the driver transistor formed in separate active regions. As illustrated in the plan view of FIG. 2, the load transistor 18 of inverter 12 is formed in thin-film layers overlying active region 44, while the driver transistor 16 of inverter 12 is formed in active region 46. Similarly, because of the symmetrical layout of memory cell 10, CMOS inverter 14 also includes a thin-film load transistor 22 formed in thin-film layers overlying active region 46, while driver transistor 20 of CMOS inverter 14 is formed in active region 44. In addition, a further reduction in surface area is provided by introducing Vss signals at nodes 40 and 42, which are coupled to nodes 24 and 26 by the cross-under regions under word lines 32 and 34. Furthermore, by extending thin-film layers 23 and 27 onto field oxide regions adjacent to active regions 46 and 44, locations are provided for electrically coupling a Vcc interconnect to both sides of memory cell 10.

Thus it is apparent that there has been provided, in accordance with the invention, a semiconductor memory cell which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different types of substrate isolation structures, such as trench isolation structures and the like, can be used to separate the active regions. It is therefore intended to include within the invention all such variations and modifications as fall within the scope of the appended claims and equivalents thereof.

We claim:

1. A semiconductor memory device comprising:
   a semiconductor substrate having first and second active regions;
   a driver transistor in the first active region, the driver transistor having a driver-gate electrode overlying a portion of the first active region and electrically coupled to the second active region;
   a thin-film load transistor overlying the first active region, the thin-film load transistor having a thin-film layer overlying the driver-gate electrode and a thin-film gate electrode overlying a channel portion of the thin-film layer and electrically coupled to a portion of the first active region, wherein a portion of the thin-film layer extends away from the first active region;
   a Vcc interconnect layer overlying the thin-film load transistor and the driver transistor, wherein the Vcc interconnect layer is electrically isolated from the thin-film gate electrode and contacts the extended portion of the thin-film layer; and
   a thin-film capacitor overlying the thin-film load transistor, wherein thin-film gate electrode functions as a lower capacitor plate, and the Vcc interconnect layer functions as an upper capacitor plate.

2. The semiconductor memory device of claim 1 further comprising:
   a wordline overlying an end portion of the first and second active regions adjacent to the driver-gate electrode; and
   Vss and bit-line contact lands electrically isolated from the Vcc interconnect layer,
   wherein the Vss contact land overlies a portion of the Vcc interconnect layer and contacts the first active region adjacent to the wordline, and
   wherein the bit-line contact land overlies a second portion of the Vcc interconnect layer and contacts the second active region adjacent to the wordline.

3. A semiconductor memory device comprising:
   a semiconductor substrate having an active region therein;
   first and second driver gate electrodes overlying a central portion of the active region;
   first and second wordlines overlying end portions of the active region and separated by the first and second driver gate electrodes;
   first and second thin-film layers overlying and isolated from the first and second driver gate electrodes respectively; and
   a thin-film gate electrode overlying the first and second thin-film layers and a portion of the first and second wordlines,
   wherein the thin-film gate electrode electrically contacts the first driver gate electrode, the first thin-film layer and the substrate on either side of the first driver gate electrode, and
   wherein the thin-film gate electrode is electrically isolated from the second thin-film layer and the first and second wordlines.

4. The semiconductor memory device of claim 3 further comprising:
   a dielectric isolation region in the substrate adjacent to the active region; and
   an extended portion of the second thin-film layer overlying a portion of the isolation region,
   wherein a portion of a Vcc interconnect layer contacts the extended portion of the thin-film layer.

5. The semiconductor memory device of claim 3 further comprising a Vcc interconnect layer overlying and electrically isolated from the thin-film gate electrode by a dielectric layer, wherein the Vcc interconnect layer, the dielectric layer, and the thin-film gate electrode form a thin-film capacitor.

6. The semiconductor memory device of claim 5 further comprising Vss and bit-line contact lands electrically isolated from the Vcc interconnect layer, wherein the Vss contact land overlies a portion of the Vcc interconnect layer and contacts the active region adjacent to the second wordline, and wherein the bit-line contact land overlies a second portion of the Vcc interconnect layer and contacts the active region adjacent to the first wordline.

7. A semiconductor memory device comprising:
   a semiconductor substrate having first and second isolation regions;
   first and second active regions in the substrate and separated by the second isolation region, wherein the first active region lies intermediate to the first and second isolation regions;
   a driver gate electrode overlying the first active region, the second isolation region, and a portion of the second active region;
   a thin-film layer overlying the driver gate electrode and separated therefrom by an insulation layer, wherein a contact portion of the thin-film layer extends beyond the first active region and overlies a portion of the first isolation region;

a first thin-film gate electrode overlying and electrically isolated from a channel portion of the thin-film layer;

a second thin-film gate electrode contacting a portion of the second active region, the driver gate electrode, and the thin-film layer; and a Vcc interconnect layer overlying and electrically isolated from the first and second thin-film gate electrodes, wherein a portion of the Vcc interconnect layer contacts the contact portion of the thin-film layer.

8. The semiconductor memory device of claim 7 further comprising a thin-film capacitor having an upper plate integral with the Vcc interconnect layer and a first lower plate integral with the first thin-film gate electrode and a second lower capacitor plate integral with the second thin-film gate electrode.

9. A semiconductor memory device comprising:

first and second active regions;

first and second driver-gate electrodes orthogonally overlying the first and second active regions first and second wordlines orthogonally overlying end portions of the first and second active regions and separated by the first and second driver-gate electrodes;

first and second thin-film layers overlying the first and second driver-gate electrodes respectively, wherein each thin-film layer has a contact portion which extends beyond the active regions;

first and second thin-film gate electrodes orthogonally overlying a channel portion of the first and second thin-film layers; and first and second shared contact regions, wherein the first driver gate electrode, the first thin-film layer, the second thin-film gate electrode, and a portion of the second active region are electrically coupled in the first shared contact region, and wherein the second driver gate electrode, the second thin-film layer, the first thin-film gate electrode, and a portion of the first active region are electrically coupled in the second shared contact region.

10. The semiconductor memory device of claim 9 further comprising a Vcc interconnect layer overlying and electrically isolated from the first and second thin-film gate electrodes, and the first and second wordlines, wherein the Vcc interconnect layer contacts the contact portions of the first and second thin-film channel layers.

* * * * *